United States Patent [19]
Mathews et al.

[11] Patent Number: 5,798,280
[45] Date of Patent: Aug. 25, 1998

[54] PROCESS FOR DOPING HEMISPHERICAL GRAIN SILICON

[75] Inventors: Viju K. Mathews; Nanseng Jeng; Pierre Fazan, all of Boise, Id.

[73] Assignee: Micron Technology, Inc., Boise, Id.

[21] Appl. No.: 753,828

[22] Filed: Dec. 2, 1996

[51] Int. Cl.$^6$ ............................................. H01L 21/223
[52] U.S. Cl. ..................... 437/165; 437/47; 437/60; 437/919; 148/DIG. 14
[58] Field of Search ......................... 437/47, 52, 60, 437/919, 141, 165, 160, 162; 148/DIG. 14

[56] References Cited

U.S. PATENT DOCUMENTS

| | | |
|---|---|---|
| 5,112,773 | 5/1992 | Tuttle . |
| 5,266,514 | 11/1993 | Tuan et al. ............................ 437/60 |
| 5,366,917 | 11/1994 | Watanabe et al. ..................... 437/60 |
| 5,372,962 | 12/1994 | Hirota et al. ......................... 437/60 |
| 5,401,681 | 3/1995 | Dennison . |
| 5,407,534 | 4/1995 | Thakur . |
| 5,444,013 | 8/1995 | Akram et al. . |
| 5,444,653 | 8/1995 | Nasagawa et al. . |
| 5,494,841 | 2/1996 | Dennison et al. . |
| 5,622,889 | 4/1997 | Yoo et al. ............................. 437/47 |

*Primary Examiner*—Tuan H. Nguyen
*Attorney, Agent, or Firm*—Killworth Gottman Hagan & Shaeff LLP

[57] ABSTRACT

A process for doping hemispherical grain silicon is provided and includes the steps of providing hemispherical grain silicon and a source of a dopant material and exposing the hemispherical grain silicon to the dopant material at a temperature less than the formation temperature of the hemispherical grain silicon for a time and at a pressure sufficient for diffusion of the dopant material into the hemispherical grain silicon to occur. The grain size of the HSG silicon is not adversely affected (i.e., reduced in size or changed in shape) by eliminating the need for a high temperature annealing step.

17 Claims, 2 Drawing Sheets

5,798,280

1

PROCESS FOR DOPING HEMISPHERICAL GRAIN SILICON

BACKGROUND OF THE INVENTION

The present invention relates to semiconductor fabrication techniques, and more particularly to a process for doping hemispherical grain silicon (HSG) using elevated pressures.

The continuing trend of reducing the size of integrated circuits has forced the semiconductor industry to develop new techniques for fabricating precise components at submicron levels. Accompanying the demand for smaller components has been a growing demand for devices requiring less power consumption. In the manufacture of transistors, these trends have led the industry to develop fabrication approaches which achieve thinner cell dielectric and gate oxide layers.

In dynamic semiconductor memory storage devices, it is essential that storage node capacitor cell plates be large enough to retain an adequate charge or capacitance. The reduction in memory cell size required for high density dynamic random access memories (DRAMS), as well as other memory storage devices, has resulted in a corresponding decrease in the area available for the storage node of the memory cell capacitor. However, design and operational parameters determine the minimum charge required for reliable operation of the memory cell despite decreasing cell area.

Several techniques have been developed to increase the total charge capacity of the cell capacitor without significantly affecting the cell area. These techniques include utilizing trench and stacked capacitors as well as the use of new capacitor dielectric materials having higher dielectric constants.

One common material utilized for the capacitor plates is conductively doped polysilicon. Such material is so utilized because of its compatibility with subsequent high temperature processing, good thermal expansion properties with $SiO_2$, and its ability to be conformally deposited over widely varying topography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material electrically conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at water temperatures of less than approximately 580° C. will result in an amorphous silicon layer, whereas silicon deposited at temperatures higher than about 580° C. will result in a polycrystalline layer. The specific transition temperature depends on the source chemicals/precursors used for the deposition.

The prior art has recognized that capacitance of a polysilicon layer can be increased by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition of the silicon under conditions which are intended inherently to induce a rough or rugged upper polysilicon surface. This polysilicon is also referred to as hemispherical grain (HSG) polysilicon.

2

This type of polysilicon can be deposited or grown by a number of techniques including formation by first depositing an amorphous silicon film at 550° C. using He diluted $SiH_4$ (200%) gas at 1.0 Torr, followed by a subsequent high temperature transformation anneal. Hemispherical grain polysilicon is not, however, in situ doped during its deposition due to undesired reduction in grain size in the resultant film. Accordingly, methods must be utilized to conductively dope the hemispherical grain polysilicon after its deposition.

One such prior art technique uses an underlying doped layer of polysilicon with a layer of hemispherical grain polysilicon subsequently deposited thereon. During the normal course of subsequent wafer processing, heating of the wafer causes an anneal effect which drives conductivityenhancing dopant atoms from within the underlying layer into the HSG silicon layer to render that layer electrically conductive. Alternately, a dedicated anneal step can be conducted.

However, even where the polysilicon layer is excessively doped to accommodate for such out diffusion, undesirable depletion effects develop in the resultant capacitor storage node, even after a dedicated anneal step. This depletion is exhibited or manifested as a drop in the net capacitance as the voltage is swept from zero volts in the negative direction.

Another prior art technique for increasing dopant concentration in HSG silicon layers is by conducting angled ion implantation. However, rotation of the ion gun during ion implantation can lead to considerable dopant concentration non-uniformities. Further, in structures which include deep narrow contacts or trenches (i.e., high aspect ratio vertical surfaces), adequate dopant implantation is precluded in the lower portions of the contact.

Accordingly, the need still exists in the art for a process for introducing dopant ions into an HSG silicon layer that will ensure adequate and efficient doping, but without the problems of the prior art techniques, including reductions in the grain size of the HSG silicon.

SUMMARY OF THE INVENTION

The present invention meets that need by providing a process for conductively doping hemispherical grain silicon using elevated pressures and at temperatures below the temperature of formation of the HSG silicon. In this manner, the grain size of the HSG silicon is not adversely affected (i.e., reduced in size or changed in shape) by the need for a high temperature annealing step. It has been discovered that the use of elevated pressures during doping provides excellent results at temperatures lower than those used in some prior art processes.

In accordance with one aspect of the present invention, a process for doping hemispherical grain silicon is provided and includes the steps of providing hemispherical grain silicon and a source of a dopant material and exposing the hemispherical grain silicon to the dopant material at a temperature less than the formation temperature of the hemispherical grain silicon for a time and at a pressure sufficient for diffusion of the dopant material into the hemispherical grain silicon to occur. Preferably, the pressure during doping is maintained between about 5 to about 50 atmospheres (5.165 to 51.65 $kg/cm^2$), and most preferably between about 5 to about 25 atmospheres (5.165 to 25.825 $kg/cm^2$).

While different processes are used in the art to transform amorphous or polycrystalline silicon into HSG silicon, they all take place at temperatures of from about 550° C. to over 600° C. Accordingly, the step of exposing the hemispherical grain silicon to the dopant material is preferably carried out at a temperature of less than about 550° C. to avoid adverse effects on the grain size of the HSG silicon. The dopant material may be either a solid or a gas, but preferably is a gas, and the doping process is carried out in a pressurized chamber. The dopant may be selected from conventional dopant source gases such as the group consisting of $AsH_3$, $AsF_3$, $PH_3$, $PF_3$, $POCl_3$, $B_2H_6$, $BF_3$, and $BCl_3$. The type of dopant desired, either n-type or p-type, will dictate the choice of the dopant source.

In most instances, the hemispherical grain silicon will be in the form of a film or layer on a silicon wafer substrate. However, it is contemplated that the process of the present invention has applicability to other instances where a conductively doped HSG silicon is needed. In semiconductor fabrication, particularly in the fabrication of hemispherical grain silicon storage capacitor plates, the process of the present invention provides effective doping of the HSG silicon layer while avoiding the problems of prior art doping procedures.

In a preferred embodiment, the process includes the steps of forming a silicon layer over a pair of conductive lines, the silicon layer forming a conductive path to an underlying conductive region; patterning the silicon layer to form a silicon capacitor plate; and transforming the silicon capacitor plate into a hemispherical grain silicon capacitor plate. Alternatively, the silicon layer may be deposited in the form of hemispherical grain silicon and then patterned.

The hemispherical grain silicon capacitor plate is conductively doped by exposing the hemispherical grain silicon to the dopant material at a temperature less than the formation temperature of the hemispherical grain silicon capacitor plate for a time and at a pressure sufficient for diffusion of the dopant material into the hemispherical grain silicon capacitor plate to occur. A capacitor dielectric layer is formed on the hemispherical grain silicon capacitor plate followed by a second conductive silicon layer formed over the capacitor dielectric layer to complete the capacitor construction.

Accordingly, it is a feature of the present invention to provide a process for introducing dopant ions into an HSG silicon layer that will ensure adequate and efficient doping, but without the problems of the prior art techniques, including reductions in the grain size of the HSG silicon. This, and other features and advantages of the present invention, will become apparent from the following detailed description, the accompanying drawings, and the appended claims.

DETAILED DESCRIPTION OF THE PREFERRED EMBODIMENT

In a preferred embodiment of the invention, a layer of silicon is formed on a substrate, typically but not necessarily a silicon wafer, in a reaction chamber. The silicon may be either polycrystalline (poly) silicon or amorphous silicon. Alternatively, the silicon may be deposited directly in the form of hemispherical grain silicon. The formed silicon is then typically (but again not necessarily) patterned into a desired shape using techniques well known in this art. If the silicon was deposited in the form of polysilicon or amorphous silicon, it is then transformed into hemispherical grain silicon using any of the several known techniques in this art. For example, the silicon may be annealed using a fluorine-based gas mixture as taught in Thakur, U.S. Pat. No. 5,407,534.

Figure 1:
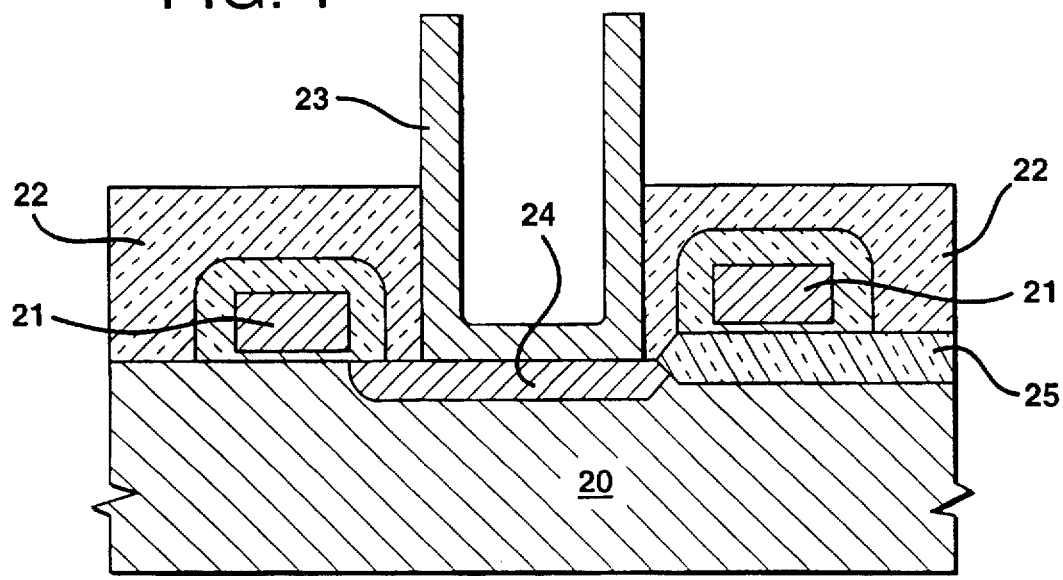
FIGS. 1, 2, and 3 are cross-sectional side views of an in-process wafer depicting the formation of a typical storage capacitor cell including a doped HSG silicon capacitor plate on a silicon wafer substrate.
Figure 2:
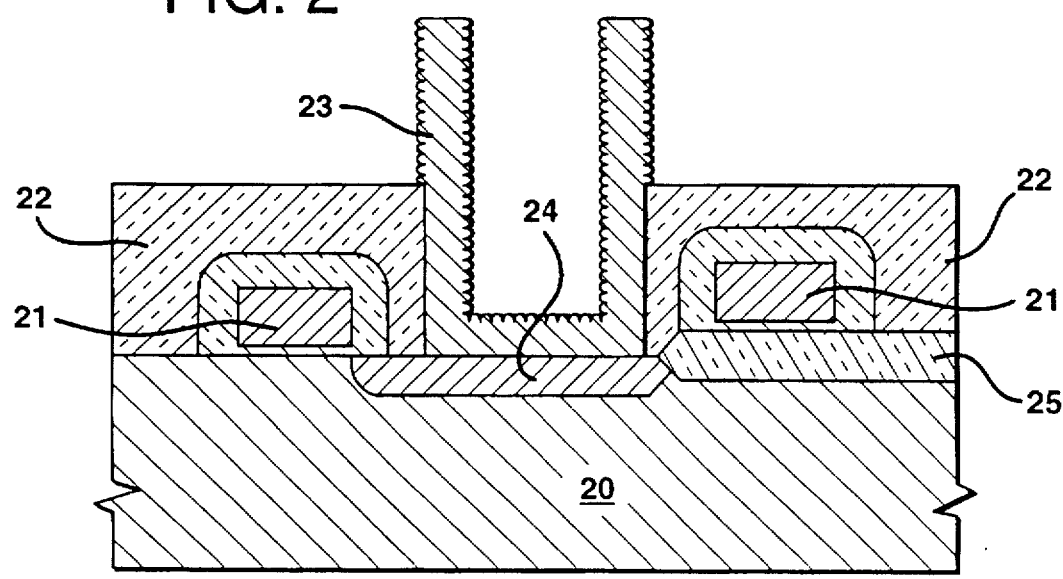
Figure 3:
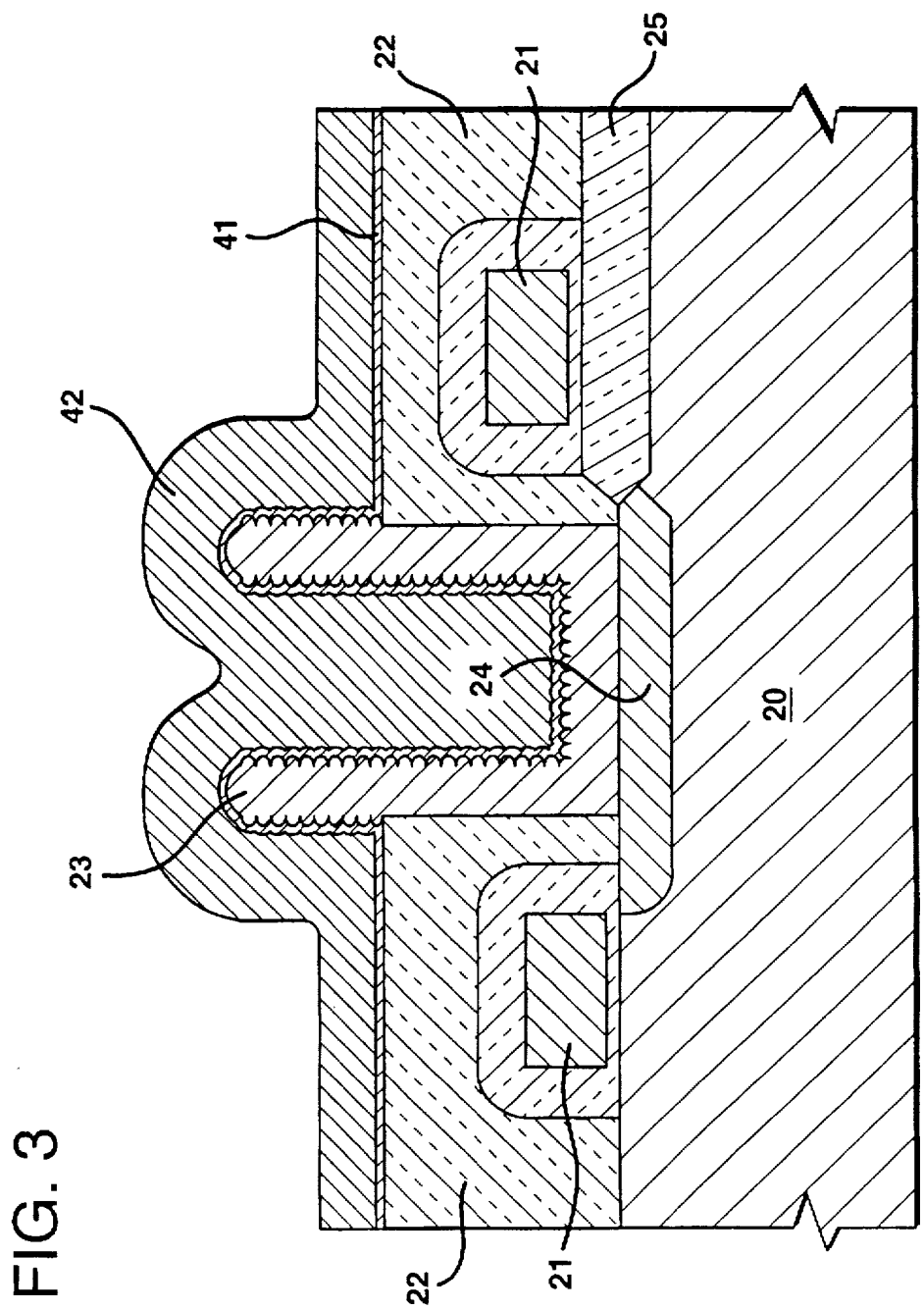

As an example of but one of many uses of the present invention, a DRAM container storage cell and a process for fabricating it is depicted in FIGS. 1–3. FIG. 1 illustrates a starting substrate 20 (typically a silicon wafer), processed with a diffusion region 24 formed therein. Diffusion region 24 is located between word lines 21, with one of the word lines sitting on a field oxide layer 25. A planarized insulating layer 22, typically of borophosphosilicate glass (BPSG), is formed over substrate 20, word lines 21, and diffusion region 24. An opening in layer 22 is formed to provide access to diffusion region 24. A capacitor plate structure 23, formed from either amorphous or polysilicon, makes contact with diffusion region 24 and extends above the surface of layer 22.

As illustrated in FIG. 2, silicon capacitor plate structure 23 is subjected to one of the processes discussed above to transform the surface of the silicon to a hemispherical grain structure. As depicted (but not drawn to scale), the relatively smooth surface of the silicon in FIG. 1 is transformed into a rugged surface in FIG. 2. The rugged surface of the HSG silicon in structure 23 is then conductively doped.

The doping may be carried out in a pressurized chamber which is capable of withstanding up to 50 atmospheres (51.65 kg/cm$^2$). Typically, the chamber is pressurized to between about 5 to about 50 atmospheres (5.165 to 51.65 kg/cm$^2$), and most preferably from about 5 to about 25 atmospheres (5.165 to 25.825 kg/cm$^2$). The temperature in the chamber is maintained at a temperature below that at which the HSG silicon was formed. This temperature is preferably below about 550° C. By using elevated pressures, effective and efficient doping of the HSG silicon is achieved at temperatures which will not adversely affect either the grain size or shape of the HSG silicon.

The dopant material may be either a solid or a gas, but preferably is a gas, which is supplied to the pressurized chamber. The dopant may be selected from conventional dopant source gases such as the group consisting of $AsH_3$, $AsF_3$, $PH_3$, $PF_3$, $POCl_3$, $B_2H_6$, $BF_3$, and $BCl_3$. The type of dopant desired, either n-type or p-type, will dictate the choice of the dopant source. Exposure times will vary, based on the desired concentration of dopant ions in the HSG silicon.

Referring now to FIG. 3, after doping, the DRAM storage cell structure is completed by forming capacitor cell dielectric layer 41 over the doped hemispherical grain silicon capacitor plate structure 23. A second conductive layer of silicon 42, typically conductively-doped polysilicon or a metal-based layer, is formed over dielectric layer 41 to complete the capacitor structure. The wafer substrate may then be subjected to further processing and fabrication steps as is known in this art.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A process for doping hemispherical grain silicon comprising the steps of:

providing hemispherical grain silicon;

providing a source of a dopant material; and exposing said hemispherical grain silicon to said dopant material at a temperature less than the formation temperature of said hemispherical grain silicon for a time and at a pressure sufficient for diffusion of said dopant material into said hemispherical grain silicon to occur.

2. A process as claimed in claim 1 in which said pressure is between about 5 to about 50 atmospheres.

3. A process as claimed in claim 1 in which said pressure is about 25 atmospheres.

4. A process as claimed in claim 1 in which said step of exposing said hemispherical grain silicon to said dopant material is at a temperature of less than about 550° C.

5. A process as claimed in claim 1 in which said dopant material is a gas.

6. A process as claimed in claim 5 in which said dopant material is selected from the group consisting of $AsH_3$, $AsF_3$, $PH_3$, $PF_3$, $POCl_3$, $B_2H_6$, $BF_3$, and $BCl_3$.

7. A process as claimed in claim 1 in which said hemispherical grain silicon is in the form of a film or layer on a substrate.

8. A process for doping hemispherical grain silicon comprising the steps of:

providing hemispherical grain silicon;

providing a source of a dopant material; and exposing said hemispherical grain silicon to said dopant material at a temperature less than the formation temperature of said hemispherical grain silicon at a pressure of between about 5 to about 50 atmospheres.

9. A process for forming and doping a layer of hemispherical grain silicon comprising the steps of:

forming a layer of silicon;

transforming said layer of silicon into hemispherical grain silicon by heating said silicon to a first temperature in the presence of a nucleating agent;

providing a source of a dopant material; and exposing said hemispherical grain silicon to said dopant material at a second temperature which is less than said first temperature for a time and at a pressure sufficient for diffusion of said dopant material into said hemispherical grain silicon to occur.

10. A process as claimed in claim 9 in which said pressure is between about 5 to about 50 atmospheres.

11. A process as claimed in claim 9 in which said pressure is about 25 atmospheres.

12. A process for forming a hemispherical grained silicon storage capacitor plate comprising the steps of:

forming a silicon layer over a pair of conductive lines, said silicon layer forming a conductive path to an underlying conductive region;

patterning said silicon layer to form a silicon capacitor plate;

transforming said silicon capacitor plate into a hemispherical grain silicon capacitor plate;

doping said hemispherical grain silicon capacitor plate by exposing said hemispherical grain silicon capacitor plate to said dopant material at a temperature less than the formation temperature of said hemispherical grain silicon for a time and at a pressure sufficient for diffusion of said dopant material into said hemispherical grain silicon capacitor plate to occur;

forming a capacitor dielectric layer on said hemispherical grain silicon capacitor plate; and forming a second conductive silicon layer over said capacitor dielectric layer.

13. A process as claimed in claim 12 in which said pressure is between about 5 to about 50 atmospheres.

14. A process as claimed in claim 12 in which said pressure is about 25 atmospheres.

15. A process for forming a hemispherical grained silicon storage capacitor plate comprising the steps of:

forming a hemispherical grain silicon layer over a pair of conductive lines, said hemispherical grain silicon layer forming a conductive path to an underlying conductive region;

patterning said hemispherical grain silicon layer to form a hemispherical grain silicon capacitor plate;

doping said hemispherical grain silicon capacitor plate by exposing said hemispherical grain silicon capacitor plate to said dopant material at a temperature less than the formation temperature of said hemispherical grain silicon for a time and at a pressure sufficient for diffusion of said dopant material into said hemispherical grain silicon capacitor plate to occur;

forming a capacitor dielectric layer on said hemispherical grain silicon capacitor plate; and forming a second conductive silicon layer over said capacitor dielectric layer.

16. A process as claimed in claim 15 in which said pressure is between about 5 to about 50 atmospheres.

17. A process as claimed in claim 15 in which said pressure is about 25 atmospheres.

* * * * *